US005608321A

United States Patent [19]

Garroway et al.

[11] Patent Number: 5,608,321
[45] Date of Patent: Mar. 4, 1997

[54] METHOD AND APPARATUS FOR DETECTING TARGET SPECIES HAVING QUADROPOLAR MUCLEI BY STOCHASTIC NUCLEAR QUADRUPOLE RESONANCE

[75] Inventors: Allen N. Garroway, Fort Washington; Joel B. Miller, Cheverly, both of Md.; David B. Zax, Ithaca, N.Y.; Ming-Yuan Liao, Stoughton, Mass.

[73] Assignee: The United States of America as represented by the Secretary of the Navy, Washington, D.C.

[21] Appl. No.: 583,146

[22] Filed: Dec. 28, 1995

[51] Int. Cl.$^6$ ............................... G01R 33/20
[52] U.S. Cl. .......................... 324/307; 324/300
[58] Field of Search .................... 324/300, 307, 324/309, 314, 312; 128/653.2

[56] References Cited

U.S. PATENT DOCUMENTS

| | | | |
|---|---|---|---|
| 3,808,518 | 4/1974 | Ignatov et al. | 324/0.5 R |
| 3,921,060 | 11/1975 | Ekimovskikh et al. | 324/0.5 A |
| 5,168,224 | 12/1992 | Maruizumi et al. | 324/307 |
| 5,206,592 | 4/1993 | Buess et al. | 324/307 |
| 5,233,300 | 8/1993 | Buess et al. | 324/307 |
| 5,365,171 | 11/1994 | Buess et al. | 324/307 |
| 5,491,414 | 2/1996 | Smith et al. | 324/307 |
| 5,500,591 | 3/1996 | Smith et al. | 324/307 |

OTHER PUBLICATIONS

Sager et al., "Pulsed NQR Measurements Using a SQUID Detector", The NQR Newsletter 1 (2) 15–18 (Feb. 1993).
Ernst et al., "Magnetic Resonance with Stochastic Excitation", J. Magnetic Resonance 3 (1) 10–27 (Jul. 1970).
Lanceaster, TTL Cookbook, 277–283. (Dec. 14, 1994).

*Primary Examiner*—Sandra L. O'Shea
*Assistant Examiner*—Raymond Y. Mah
*Attorney, Agent, or Firm*—Thomas McDonnell; John Karasek

[57] ABSTRACT

One aspect of the present invention is a method for detecting a class of target species containing quadrupolar nuclei in a specimen by nuclear quadrupole resonance, comprising: (a) generating a random or pseudo-random train of rf pulses; (b) irradiating the specimen with the train of rf pulses; (c) detecting an NQR signal in response to irradiating the specimen; (d) cross-correlating the NQR signal with the random or pseudo-random train of rf pulses, thereby generating a free induction decay signal; and (e) converting the free induction decay signal into a frequency domain signal. Another aspect of the present invention is an apparatus for carrying out the method of the invention.

19 Claims, 5 Drawing Sheets

METHOD AND APPARATUS FOR DETECTING TARGET SPECIES HAVING QUADROPOLAR MUCLEI BY STOCHASTIC NUCLEAR QUADRUPOLE RESONANCE

BACKGROUND OF THE INVENTION

1. Field of the Invention

The present invention relates generally to nuclear quadrupole resonance, and more particularly to stochastic nuclear quadrupole resonance using random or pseudo-random excitation.

2. Description of the Related Art

Nuclear quadrupole resonance (NQR) is a technique for analyzing species having quadrupolar nuclei (spin quantum number $I \geq 1$, e.g., $^{14}N$, $^{35,37}Cl$, $^{39}K$, etc.). In a typical NQR technique, a sample is excited with radio frequency (rf) radiation, to induce a precession in nuclei by irradiating the nuclei with an excitation frequency corresponding to the resonance frequency of the nuclei. As with better-known nuclear magnetic resonance (NMR), the location of a resonance frequency in a sample depends on the specific chemical environment around a resonant nucleus.

In addition to the location of resonant frequency peaks, the width of resonant frequency peaks can provide information about the material being analyzed. Accordingly, it may be desirable to monitor the widths (typically the full width at half maximum, FWHM) of NQR peaks in various materials.

As shown in FIG. 1, a typical excitation pulse used in NQR detection of a typical 1 cm$^3$ specimen has a short duration (typically on the order of 0.01–0.1 ms) and a large amplitude (typically on the order of 200 $V_{r.m.s}$, corresponding to 800 W at 50 $\Omega$). This type of excitation pulse results in a broad excitation frequency distribution. However, the higher amplitude of this excitation pulse will dramatically increase the peak power requirement of the excitation source, since the peak power is proportional to the square of the peak voltage. Reducing the power requirements of NQR excitation has been a continuing concern in the art. See U.S. Pat. No. 5,233,300, issued Aug. 3, 1993 to Buess et al., for "DETECTION OF EXPLOSIVE AND NARCOTICS BY LOW POWER LARGE SAMPLE VOLUME NUCLEAR QUADRUPOLE RESONANCE (NQR)", incorporated by reference herein, in its entirety for all purposes.

SUMMARY OF THE INVENTION

Accordingly, it is an object of this invention to provide NQR detection for a broad range of target species having quadrupolar nuclei, including many narcotics and explosives.

It is a further object of this invention to provide NQR detection for targets with broad NQR signals and/or targets in large volume analytes, without the need for high peak power excitation.

It is a further object of this invention to provide NQR detection for certain target species, including nitrogen- and chlorine-containing explosives and narcotics, especially narcotics such as cocaine hydrochloride.

It is a further object of this invention to provide NQR analysis based upon the location and/or the width of NQR peaks.

These and additional objects of the invention are accomplished by the structures and processes hereinafter described.

One aspect of the present invention is a method for detecting a class of target species containing quadrupolar nuclei in a specimen by nuclear quadrupole resonance, comprising: (a) generating a random or pseudo-random train of rf pulses; (b) irradiating the specimen with the train of rf pulses; (c) detecting an NQR signal in response to irradiating the specimen; (d) cross-correlating the NQR signal with the random or pseudo-random train of rf pulses, thereby generating a free induction decay signal; and (e) converting the free induction decay signal into a frequency domain signal. Another aspect of the present invention is an apparatus for carrying out the method of the invention.

Such a system will have a dramatically lower peak power requirement than systems of the prior art. For example, stochastic excitation pulses typically induce nutations of 1° to 10°, as opposed to nutations of $\approx 100°$ used in systems of the prior art. This results in reducing the peak power requirement by a factor of 100 to 10,000 for constant bandwidth, or increasing the excitation bandwidth by a factor of 10 to 100 at constant peak power. Since the cost of an amplifier increases significantly with its peak power output, the present invention provides a way to make an NQR detector for a given bandwidth much cheaper than those presently available.

Moreover, it has now been discovered that several target species of interest have very broad NQR peaks. Most notably, the chlorine in cocaine hydrochloride has NQR resonance lines that are 20–30 kHz wide. Equivalently, certain analytes (such as TNT) have a number of signature peaks that are broadly spaced apart. Detecting these peaks simultaneously in large coils would be prohibitively expensive, if even possible, using the techniques of the prior art. As skilled practitioners will recognize, the peak power requirement for an amplifier increases linearly with coil volume.

BRIEF DESCRIPTION OF THE DRAWINGS

A more complete appreciation of the invention will be obtained readily by reference to the following Description of the Preferred Embodiments and the accompanying drawings in which like numerals in different figures represent the same structures or elements, wherein.

DETAILED DESCRIPTION OF THE PREFERRED EMBODIMENTS

Figure 1:
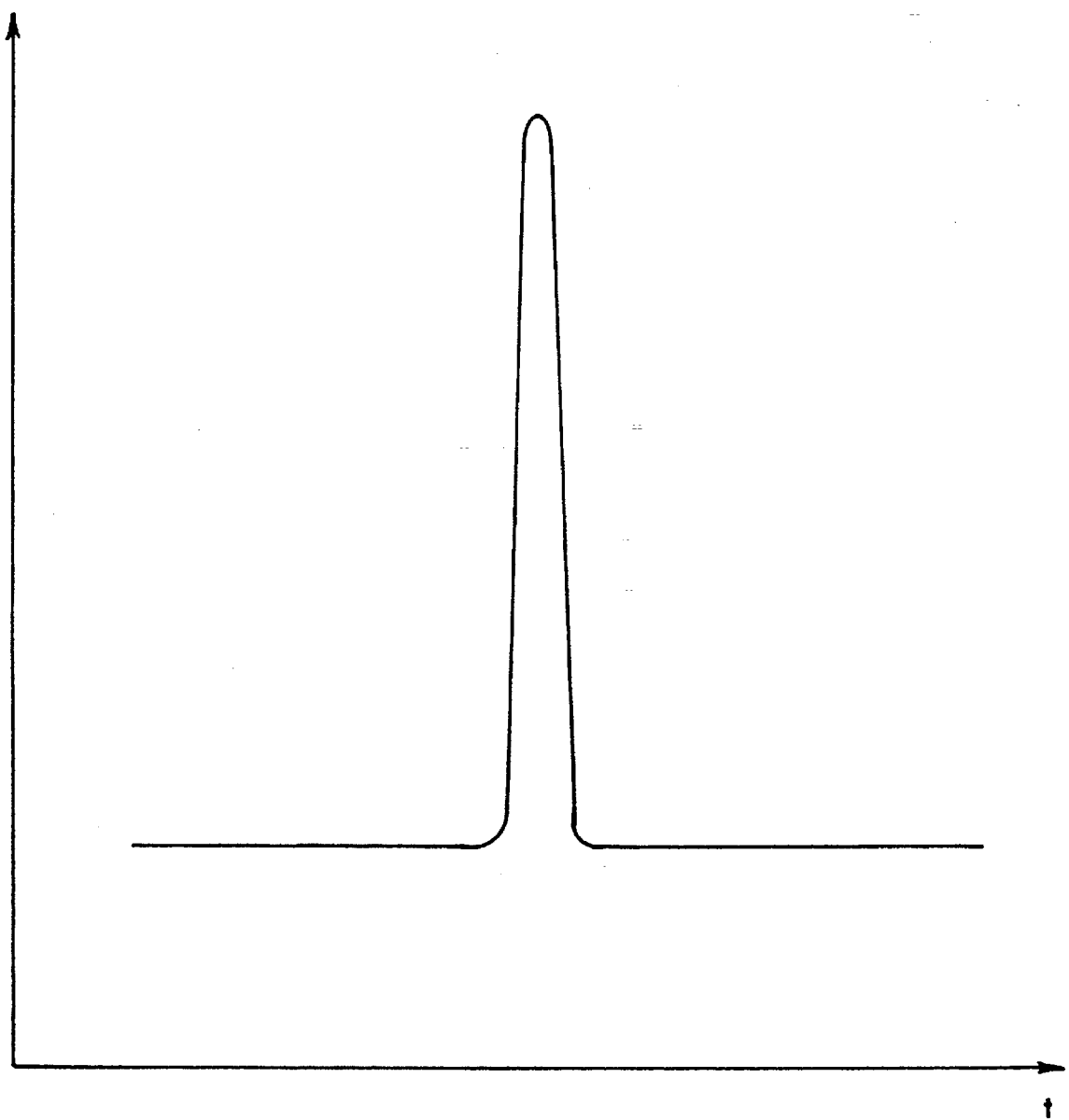
FIG. 1 shows a time domain plot of a typical excitation pulse used in prior art NQR detection.
Figure 2:
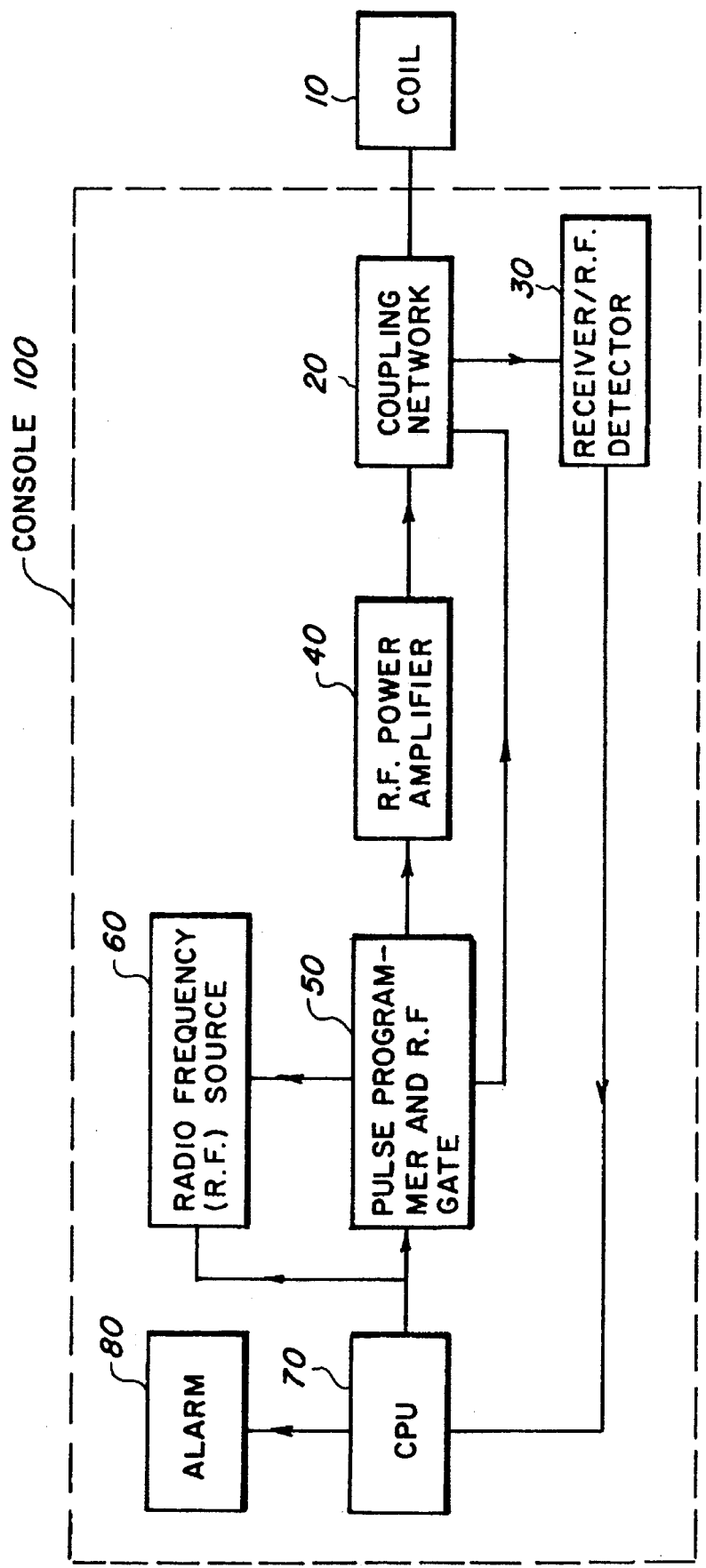
FIG. 2 shows a block diagram for the NQR system of the present invention.

FIG. 2 shows a block diagram for the NQR detection system for a preferred embodiment of the present invention. A radio frequency source 60, a pulse programmer and RF gate 50 and an RF power amplifier 40 are provided to generate a train of random or pseudo-random radio frequency pulses having a predetermined frequency distribution to be applied to irradiating and detecting means (typically a coil) 10. A coupling network 20 conveys the train of radio frequency pulses from the radio frequency source 60, the pulse programmer and RF gate 50 and the RF power amplifier 40 to the coil 10. The coupling network 20 also conducts the signal to the receiver/RF detector 30 from the coil 10 while a specimen is irradiated with the train of radio frequency pulses. A central processing unit (CPU) 70 controls the radio frequency source 60 and the pulse programmer and RF gate 50 to a predetermined frequency which coincides or is near to an NQR frequency of the type of explosive (e.g., all RDX-based explosives) or narcotic desired to be detected. The CPU 70 also processes the data and compares the NQR signal with a predetermined threshold value. When the predetermined threshold value is exceeded, an optional alarm 80 is activated in response to the comparison by the CPU 70. The receiver/RF detector 30, the RF power amplifier 40, the pulse programmer and RF gate 50, the radio frequency source 60, the CPU 70 and the alarm 80 may be contained in a console 100 with only the coil 10 and the coupling network 20 being outside of the console 100.

Although in this embodiment the same means is used for both irradiating the sample with the excitation radiation and detecting the NQR signal (e.g., one coil is used for both functions), this is not a requirement of the invention. Separate irradiation and detection means (e.g., separate irradiation and detection coils) may be employed if desired. For simplicity, only one coil is used typically.

Figure 3:
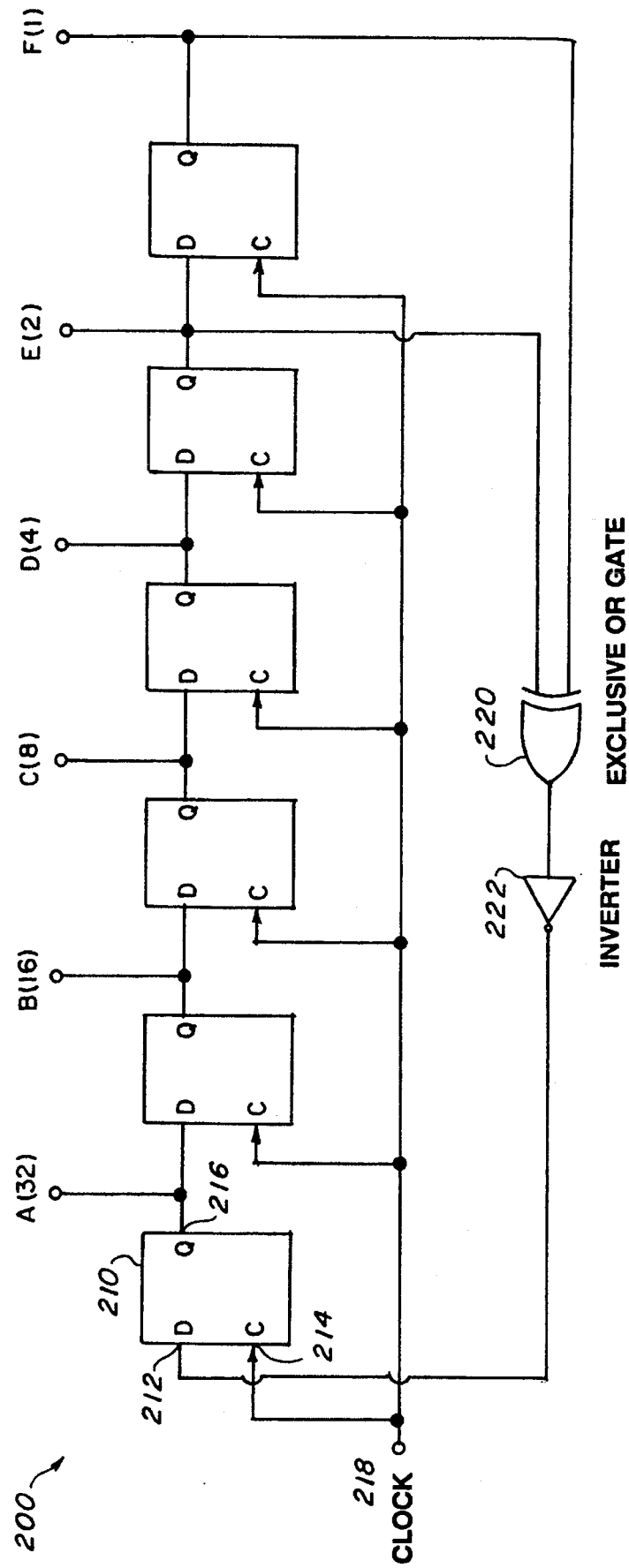
FIG. 3 shows a typical circuit for generating a pseudo-random sequence.
Figure 4:
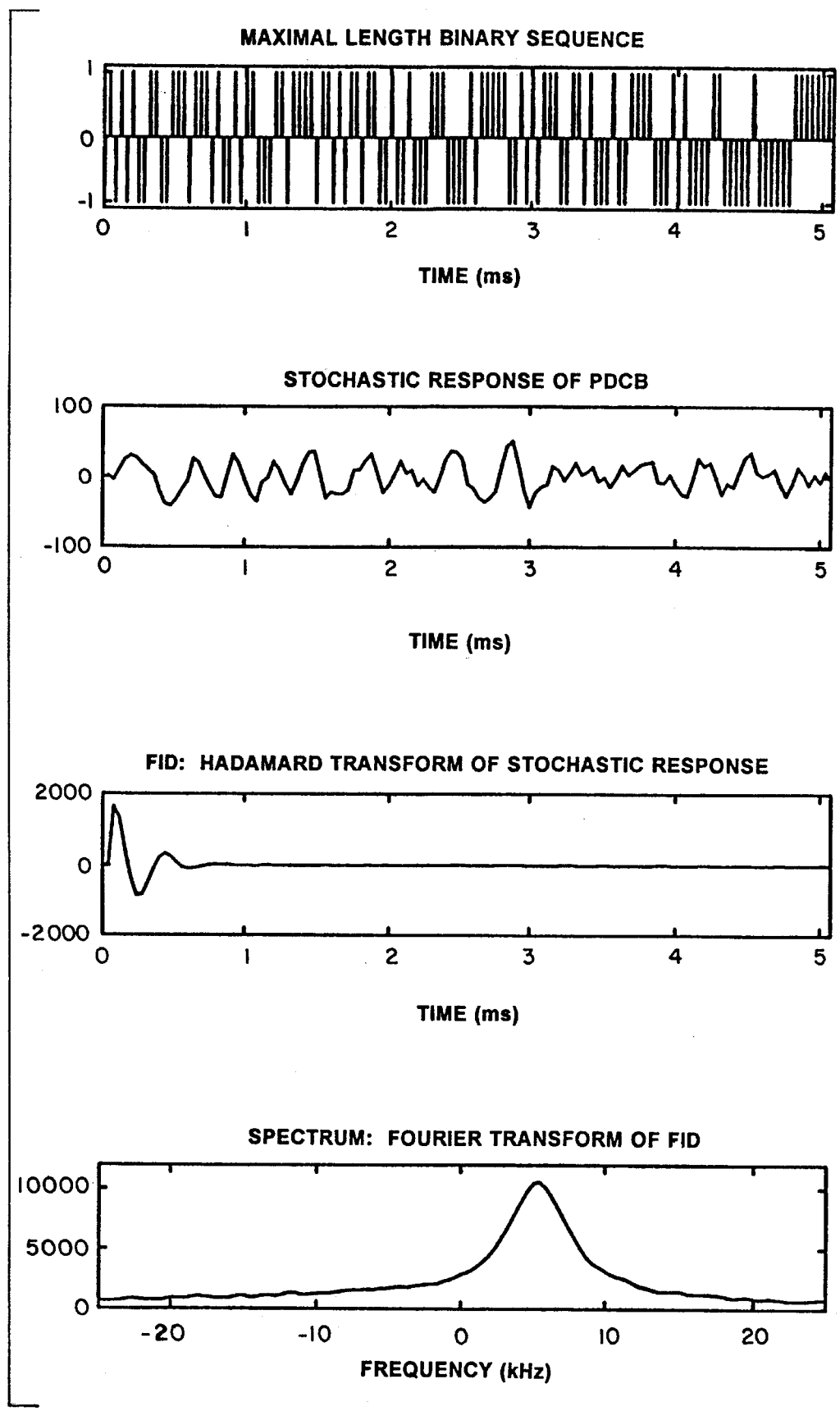
FIG. 4 shows, from Example 1, the pseudo-random excitation pulse train (upper trace), the stochastic response of para dichlorobenzene (PDCB) to this excitation (second trace), the fid of this stochastic response (third trace), and the frequency spectrum of PDCB (bottom trace).

The train of radio frequency pulses is preferably a pseudo-random train of pulses, (such as the pseudo-random train of radio frequency pulses shown in FIG. 4, upper trace, discussed infra) may be generated using a shift-register pseudo-random sequencer, such as the one shown in FIG. 3. As shown in FIG. 3, a shift-register pseudo-random sequencer 200 has several (as shown here, six) stages 210. Each stage 210 has an input 212, a clock connection 214, and an output 216. The stages are connected in series, with the output of the ith stage connected to the input of the (i+1)th stage. With each clock 218 pulse, the input from the previous clock cycle is transferred to the output, and thus transferred to the input of the next stage. The outputs of the nth and nth-1 stages are input to an Exclusive Or (XOR) gate 220, and the output of this XOR gate 220 is input to a NOT gate 222. The NOT gate 222 output is input to the first stage in the sequencer 200. Typically, the clock 218 is connected in parallel to the clock connections 214.

More typically, this circuit is a software-generated virtual circuit. The pulses in this pseudo-random pulse train will have equal amplitude and pseudo-randomly shifted phase (shifted between 0° and 180°). See generally Lancaster *TTL Cookbook* pp. 277–83 (Howard W. Sam & Co. 1979). See also Paff et al. *Adv. in Magn. & Optical Reson.* 17 1 (1992) and Blümich, *Prog. NMR Spectrosc.* 19 331 (1987).

As used herein, a pseudo-random pulse train will have a selected pulse width $\tau$ and a selected interval $\Delta t$ between pulses. The pseudo-random pulse train will have a selected number of steps to go through before the sequence repeats. The maximum number of steps for an n-stage shift-register pseudo-random sequencer is given by $2^n-1$. A pseudo-random sequencer with this number of steps is referred to herein as a maximal length pseudo-random sequencer. There are several characteristic features to this pseudo-random pulse train. One is that for any short ($<\Delta t \cdot (2^n-1)$) sample, this pulse train will look and behave like random noise, but it will repeat every $2^n-1$ clock cycles.

During excitation by a stochastic (random or pseudo-random) rf pulse train, a sample containing a quadrupolar target will return a stochastic response curve (such as the one shown in FIG. 4, second trace, discussed infra). In the case of pseudo-random excitation, this stochastic response curve preferably may be cross-correlated to the free induction decay curve using a Hadamard transform. A Hadamard transform converts a stochastic response vector $\vec{X}$ into a free induction decay curve $\vec{Y}$, according to the equation: $\vec{Y}=H\vec{X}$ where H is a Hadamard matrix. A Hadamard matrix is a unique square n×n matrix for a given pseudo-random sequence of n steps, where the first row is the sequence, the second row is the sequence shifted by 1, the third row is the sequence shifted by 2, and the nth row is the sequence shifted by n−1.

Alternatively, or in the case where true random excitation is used, true cross-correlation may be used to generate the free induction decay curve. In true cross-correlation, the signal output y(t) is correlated to the input sequence x(t) via the memory function k(τ) such that $$y(t) = \int_0^\infty k(\tau)x(t-\tau)d\tau.$$

The free induction decay curve is a time domain curve. By performing a Fourier transform on this curve, a frequency domain NQR spectrum of the target species may be obtained.

Having described the invention, the following examples are given to illustrate specific applications of the invention, including the best mode now known to perform the invention. These specific examples are not intended to limit the scope of the invention described in this application.

EXAMPLE 1

Pseudo-random stochastic NQR analysis was performed on a 74 g sample of para dichlorobenzene (PDCB). The $^{35}$Cl resonance is at 34.27 MHz at room temperature. The rf coil used was a four-turn ribbon wire solenoid with an internal copper sheath, to provide a coil volume of about 225 cm$^3$. The coil was overcoupled to reduce the quality factor, Q, to 40.

Results are shown in FIG. 4. The upper trace shows the pseudo-random excitation pulse train, the second trace shows the stochastic response of PDCB to this excitation, the third trace shows the fid of this stochastic response, and the bottom trace shows the frequency spectrum of PDCB.

A 127-step maximal length pseudo-random binary sequence was used to modulate the rf phase by 0° or 180°. The rf pulses were 5 μs long, and the time between pulses was 40 μs, providing a Nyquist frequency of 12.5 kHz (25 kHz bandwidth). The tip angle of the rf pulses was approximately 5°. The peak rf power was about 170 W. For a coil of this volume, the conventional single-pulse NQR approach would require a peak power of 55 kW (!) for a 5 μs 90° pulse. The 127-step sequence was repeated every 5 ms. Here, 128 sequences were co-added to improve the S/N ratio.

The NQR signal at 34 MHz was demodulated (conventionally) and a 100 kHz low pass filter was applied. The response of the spin system is shown as the stochastic response. When cross-correlated against the stochastic excitation, the conventional free induction decay (fid) is obtained. In this case, however, a Hadamard transform was used in place of the conventional cross-correlation.

The fid was then conventionally Fourier transformed to produce the spectrum of the NQR signal. Note that the baseline in FIG. 4 is reasonably flat, an advantage characteristic of the stochastic approach. This particular spectrum is rather broad, with intensity in the wings due to stray magnetic field of about 5 gauss across the sample.

EXAMPLE 2

Figure 5:
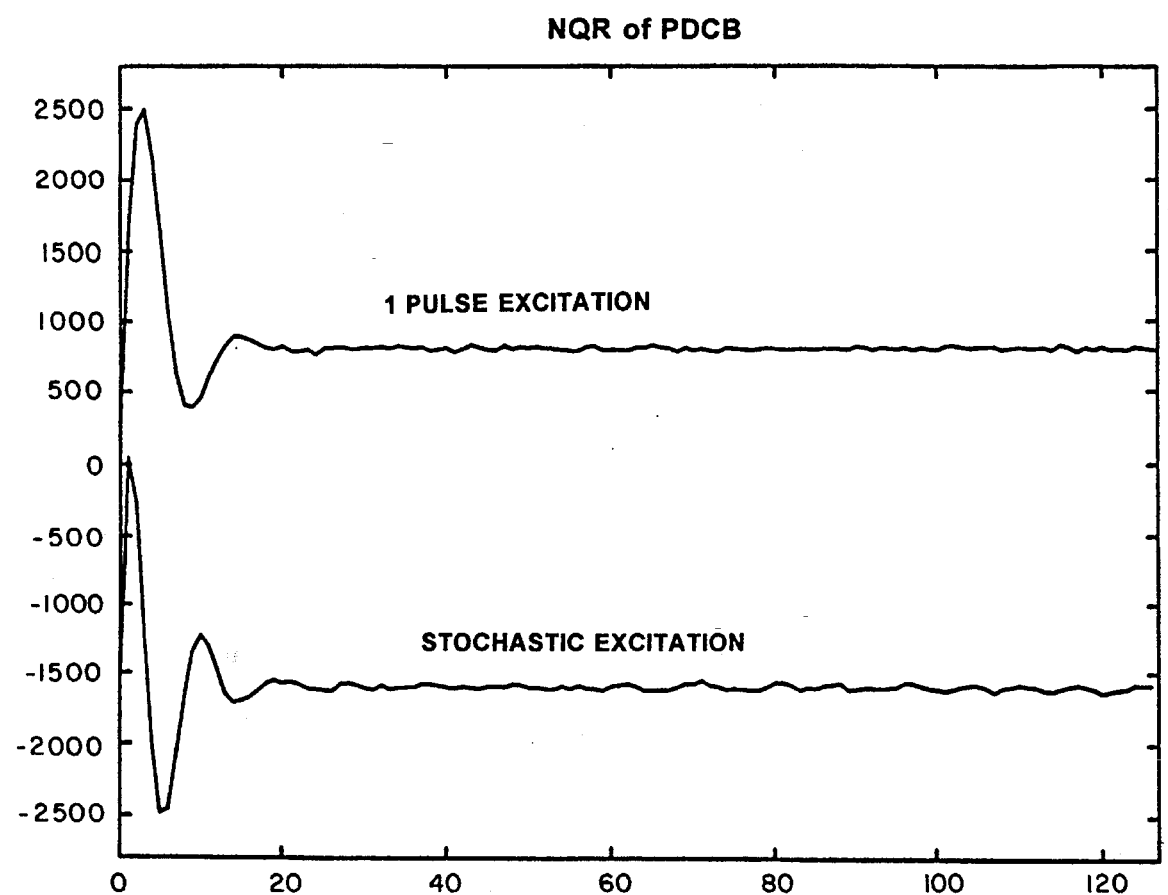
FIG. 5 shows, from Example 2, the NQR fids of PDCB after pulse excitation (top trace) and stochastic excitation (bottom trace)

This example compares the NQR fid of the 34.27 MHz $^{35}$Cl resonance of a 74 g sample of PDCB obtained by conventional one-pulse and stochastic methods. The top trace in FIG. 5 is the conventional response to a one-pulse excitation. The bottom trace in FIG. 5 was the result of stochastic excitation and was obtained by cross-correlating the stochastic NQR response with the stochastic pseudo-random excitation sequence, as described in Example 1. Note that the S/N ratios are comparable: the stochastic approach is shown to be as efficient as the conventional one-pulse method.

The experimental parameters in the two sequences were shown to facilitate comparison for an equivalent sampling time, with the parameters separately optimized on both the one-pulse and stochastic sequence to provide optimal signal-to-noise ratios. For the one-pulse sequence, an equivalent recycle delay of 25 ms was chosen to approximate the NQR $T_1$ value (22 ms) in order to maintain the maximum signal-to-noise ratio per unit time for the 90° excitation. The one-pulse sequence was repeated 20 times for a total sampling time of 0.5 s. A 5 ms duration, 127-step pseudo-random pulse train was used for the stochastic experiment, with a 5° rf pulse. The sequence was repeated 100 times, for a total sampling time of 0.5 s. In both cases, a 100 kHz low pass filter was applied to the demodulated NQR signals.

Obviously, many modifications and variations of the present invention are possible in light of the above teachings. It is therefore to be understood that, within the scope of the appended claims, the invention may be practiced otherwise than as specifically described.

What is claimed is:

1. A device for detecting a class of target species containing quadrupolar nuclei in a specimen by nuclear quadrupole resonance, comprising:
   (a) pulse generating means for generating a random or pseudo-random train of rf pulses;
   (b) irradiating means for irradiating said specimen with said train of rf pulses;
   (c) detecting means for detecting an NQR signal in response to irradiating said specimen;
   (d) coupling means for transmitting said train of rf pulses to said irradiating means;
   (e) coupling means for receiving said NQR signal from said detecting means;
   (f) cross-correlating means for cross-correlating said received NQR signal with said random or pseudo-random train of rf pulses, thereby generating a free induction decay signal; and
   (g) transform means for converting said free induction decay signal into a frequency domain signal.

2. The device of claim 1, wherein said irradiating means and said detecting means comprise a coil.

3. The device of claim 1, wherein said irradiating means comprises a first coil and said detecting means comprises a second coil.

4. The device of claim 1, wherein said pulse generating means are pulse generating means for generating a pseudo-random train of rf pulses.

5. The device of claim 4, wherein said target species are selected from the group consisting of narcotics and explosives.

6. The device of claim 5, wherein said target species are selected from the group consisting of cocaine hydrochloride and trinitrotoluene.

7. The device of claim 4, wherein said cross-correlating means comprise means for computing a Hadamard transform.

8. The device of claim 4, further comprising means for computing the width of a selected peak in said frequency domain signal.

9. The device of claim 4, wherein said pseudo-random train of rf pulses has a preselected frequency distribution.

10. The device of claim 9, wherein said preselected frequency distribution includes an NQR peak of said target species.

11. The device of claim 9, wherein said preselected frequency distribution includes the full width at half maximum of an NQR peak of said target species.

12. A method for detecting a class of target species containing quadrupolar nuclei in a specimen by nuclear quadrupole resonance, comprising:
   (a) generating a random or pseudo-random train of rf pulses;
   (b) irradiating said specimen with said train of rf pulses;
   (c) detecting an NQR signal in response to irradiating said specimen;
   (d) cross-correlating said NQR signal with said random or pseudo-random train of rf pulses, thereby generating a free induction decay signal; and
   (e) converting said free induction decay signal into a frequency domain signal.

13. The method of claim 12, wherein said step of generating a random or pseudo-random train of rf pulses comprises generating a pseudo-random train of rf pulses.

14. The method of claim 13, wherein said target species are selected from the group consisting of narcotics and explosives.

15. The method of claim 14, wherein said target species are selected from the group consisting of cocaine hydrochloride and trinitrotoluene.

16. The method of claim 13, wherein said step of cross-correlating comprises computing a Hadamard transform.

17. The method of claim 13, wherein said step of generating a pseudo-random train of rf pulses comprised generating a pseudo-random train of rf pulses having a preselected frequency distribution.

18. The method of claim 17, wherein said preselected frequency distribution includes an NQR peak of said target species.

19. The method of claim 18, wherein said preselected frequency distribution includes an NQR peak of said target species.

\* \* \* \* \*

UNITED STATES PATENT AND TRADEMARK OFFICE
CERTIFICATE OF CORRECTION

PATENT NO.  : 5,608,321
DATED       : March 4, 1997
INVENTOR(S) : GARROWAY et al.

It is certified that error appears in the above-identified patent and that said Letters Patent is hereby corrected as shown below:

Title page, item 54, line 3: Change "MUCLEI" to --NUCLEI--.

Title page, item 56, column 2, line 9: Change "Lanceaster" to --Lancaster--.

Column 1, line 3: Change "MUCLEI" to --NUCLEI--.

Signed and Sealed this

Twentieth Day of May, 1997

Attest:

BRUCE LEHMAN

Attesting Officer

Commissioner of Patents and Trademarks